US008583997B2

(12) United States Patent
Frederiksen et al.

(10) Patent No.: US 8,583,997 B2
(45) Date of Patent: Nov. 12, 2013

(54) METHOD AND DEVICE FOR PADDING OPTIMIZATION OF SEGMENTED TURBO CODES

(71) Applicants: Frank Frederiksen, Klarup (DK); Bernhard Raaf, Neuried (DE)

(72) Inventors: Frank Frederiksen, Klarup (DK); Bernhard Raaf, Neuried (DE)

(73) Assignee: Nokia Siemens Networks GmbH & Co. KG, Munich (DE)

( * ) Notice: Subject to any disclaimer, the term of this patent is extended or adjusted under 35 U.S.C. 154(b) by 0 days.

(21) Appl. No.: 13/729,754

(22) Filed: Dec. 28, 2012

(65) Prior Publication Data

US 2013/0124939 A1    May 16, 2013

Related U.S. Application Data

(63) Continuation of application No. 12/450,301, filed as application No. PCT/EP2008/002273 on Mar. 20, 2008.

(30) Foreign Application Priority Data

Mar. 20, 2007   (EP) ..................................... 07005722
Oct. 8, 2007   (EP) ..................................... 07019618

(51) Int. Cl.
    *H03M 13/03*      (2006.01)

(52) U.S. Cl.
    USPC ........................................................ 714/786

(58) Field of Classification Search
    USPC ........................................ 714/752, 786, 746
    See application file for complete search history.

(56) References Cited

U.S. PATENT DOCUMENTS

| 6,437,711 | B1 | 8/2002 | Nieminen et al. |
| 6,530,059 | B1 | 3/2003 | Crozier et al. |
| 7,685,500 | B2 | 3/2010 | Jacobsen et al. |
| 2003/0014715 | A1 | 1/2003 | Lobinger et al. |

FOREIGN PATENT DOCUMENTS

| EP | 07005722 | 3/2007 |
| EP | 07019618 | 10/2007 |
| WO | 02/17549 | 2/2002 |
| WO | PCT/EP/2008/002273 | 3/2008 |

OTHER PUBLICATIONS

Andre Kaup, Objected textures coding of moving video in MPEG-4, Feb. 1999, IEEE Trans. on Ckt. & Sys. for video Tech. vol. 9, No. 1, p. 5-15.*
"Code Block Segmentation for LTE Channel Encoding," 3GPP TSG RAN WG1 #48, TDOC R1-071059, Feb. 12-16, 2007, 5 pages.
U.S. Office Action for U.S. Appl. No. 12/450,301, mailed on Sep. 28, 2012.
Zheng et al., Pilot assisted SOVA decoding for turbo codes, 2004, IEEE, p. 2285-2289.

(Continued)

*Primary Examiner* — Shelly A Chase
(74) *Attorney, Agent, or Firm* — Staas & Halsey LLP

(57) ABSTRACT

A method for forming a bit sequence having a number of M bits from a bit sequence having a number of N bits, wherein M/2<N<M, involves extending said bit sequence by M-N bit positions, segmenting said extended bit sequence into at least two blocks with different numbers of bit positions such that the number of bit positions in the first block is less than the number of bit positions in the last block, and filling empty bit positions with bits having a pre-determined value.

8 Claims, 3 Drawing Sheets

(56) References Cited

OTHER PUBLICATIONS

Lee et al., The optimum number of inserted known bits in rate matching turbo codes with know bits, 1999, IEEE, p. 12-14.

Rousseaux et al., An iterative procedure for semi blind symbol estimation in a multipath SISO channel context exploiting finite alphabet properties, 2002, IEEE, p. 21-1 to 21-5.

Notice of Allowance for U.S. Appl. No. 12/450,301, mailed on Feb. 22, 2013.

* cited by examiner

METHOD AND DEVICE FOR PADDING OPTIMIZATION OF SEGMENTED TURBO CODES

CROSS REFERENCE TO RELATED APPLICATIONS

This application is a Continuation of U.S. patent application Ser. No. 12/450,301 filed on Dec. 31, 2009, which is based on and hereby claims priority to PCT Application No. PCT/EP2008/002273 filed on Mar. 20, 2008 and EP Application Nos. EP07005722 and EP07019618 respectively filed on Mar. 20, 2007 and Oct. 8, 2007, the contents of which are hereby incorporated by reference.

BACKGROUND OF THE INVENTION

In communications systems channel coders are used for coding the data bits to be transmitted to a corresponding receiver. By the channel coding, redundant bits are added to the actual data bits enabling more reliable detection of the data bits in the receiver. With regard to channel coding the use of so-called turbo coders is known, the turbo coders being provided for example for the Universal Mobile Telecommunication System (UMTS).

The data bits are supplied to the turbo coder block wise. Each data block supplied to the turbo coder must have a corresponding size, i.e. a corresponding number of data bits. All admissible block sizes for turbo codes are multiples of a pre-determined size (e.g. 8 or 64 bit), up to a maximum size. If the data blocks supplied to the turbo coder have a block size that is smaller than the minimum block size, the length of the data blocks must be correspondingly adapted before the data blocks are supplied to the turbo coder. One such adaptation mechanism is zero padding, which is also known from the related art in UMTS.

Bit sequences that are to be turbo-encoded which are larger than the turbo coder can handle must be segmented into blocks that the coder can process. These blocks usually have a size being defined by an integer multiple of the minimal block size, and up to the maximum block size of the turbo coder. However, the sizes of segmented blocks can also be selected from a set of pre-determined admissible block sizes. The set of admissible block sizes does not necessarily contain only (or all possible) integer multiples of a minimum block size up to the maximum block size. It is to be noted that it is not required that all blocks have the same size. In many situations it can even be more advantageous to use different block sizes, e.g. to reduce the needed zero padding and thus the additional overhead.

In order to adapt the bit sequences to be turbo coded to the minimum required length M that can be constructed by a sum of blocks having sizes being integer multiples of the minimal block size, the data bits of each bit sequence can be filled up with predefined bits ("dummy bits"), for example having the value "0". The insertion of the dummy bits into the data blocks is also referred to as "padding".

However, the filling of the individual bit sequences with dummy bits at the end is disadvantageous insofar as non-constant data bits are generated as a result thereof in the event of resetting or termination of the turbo coder, which data bits either cannot be utilized or increase the complexity of the receiver.

US 2003/0014715 A1 suggests that padding bits for turbo coders should be filled in at the beginning, not the end of data blocks/bit sequences. This however requires shifting a possibly large number of bits to the end of the data blocks to free space for filling in the padding bits at the beginning of the data block. While this approach is straightforward and can easily be carried out, it involves shifting a large number (e.g. thousands) of bits, which is disadvantageous with regard to power consumption and processing time. This problem occurs when considering octet aligned operations, which are commonly used in data processing applications.

The publication "Code Block Segmentation for LTE Channel Encoding", TDOC R1-071059 of 3GPP TSG RAN WG 1 Meeting #48, Feb. 12-16, 2007, page 1-5, St. Louis, USA proposes a modification to former code block segmentation, wherein instead of using one interleaver size for all segments of a transport block, two adjacent interleaver sizes may be used to minimize the number of filler bits for a given transport block. The filler bits are applied to at most one segment irrespective of the transport block size.

The document U.S. Pat. No. 6,437,711 B1 discloses a segmentation mechanism for a block encoder and a method for encoding with a block encoder. The block encoder is capable of processing consecutive coding blocks whose size has an upper limit which is smaller than the size of the input data block. The method comprises (a) determining the length of the input data block before encoding any of its data with the block encoder, (b) dividing the input data block to a plurality of segments wherein all segments are of substantially equal size and no segment is larger than the upper limit and (c) processing each segment with the block encoder. If the last segment is shorter than the remaining segments, fill bits can be added to the last segment such that its length equals that of the remaining segments.

Furthermore, the related art methods of segmentation of large bit sequences into blocks suitable for a turbo coder arrange larger blocks or segments first, and smaller segments last. Then the first segments are padded. This results in deteriorated performance of the last block with respect to error rates. For convolution codes the error probability increases with block size because there are more bits that can be decoded erroneously. Only for turbo codes this is offset because turbo codes work better and better with increasing block size. With turbo coders larger blocks perform better with respect to error rate, and padding further increases the error rate performance, due to the added redundancy. Note that the error rate performance is also increased if the padded bits and possibly also corresponding parity bits are later on removed again in subsequent processing steps, as is explained already in the previously mentioned US application.

Therefore the related art way of performing the segmentation and padding creates a double penalty for the last block. The last block performs poorer already due to its reduced length, compared with the larger blocks before it, and also it does not benefit from the increased redundancy from padding, as only the large blocks are padded.

SUMMARY

The inventors propose an improved segmentation and padding scheme that can help to reduce or even completely avoid the above mentioned drawbacks.

According to an aspect of the proposal a method is provided for forming a bit sequence having a number of M bits from a bit sequence having a number of N bits, wherein $$\frac{M}{2} < N < M,$$

comprising:
    extending the bit sequence by M-N bit positions;
    selecting M-N bit positions within the bit sequence including the first bit position;
    re-ordering the bit sequence by relocating at least the bits on the selected positions such that the first bit position is empty and such that at least one bit remains at its original position; and
    filling empty bit positions with bits having a predetermined value.

With this method the number of bits that are relocated can be reduced compared to the related art, while at the same time padding can be performed at the beginning of a bit sequence, which is advantageous.

According to an exemplary embodiment the re-ordering is performed such that the first M-N bit positions of the bit sequence are empty before padding. In a simple embodiment, for example to be employed when the required bit sequence of length M can be achieved by forming a bit sequence comprising a single block of a size slightly smaller than M, the empty bit positions are created in the first section of the bit sequence This is achieved by relocating the bits on the corresponding first bit positions to the last part of the bit sequence (that has been appended with the M-N bits), while a large number of bits in between can remain at their original positions.

According to an exemplary embodiment the method further comprises
    segmenting the bit sequence with number of bits M into at least two blocks such that the number of bits in the first block is less the number of bits in the last block.

As a turbo coder requires not only a minimum block size in a bit sequence (usually being an integer multiple of the minimal block size) but also has a maximum admissible block size (e.g. 6144 bits), it will often be required to segment bit sequences that are too large for the turbo coder as a single block. An important aspect of the improved padding and segmenting scheme includes performing the segmentation such that smaller blocks are located in front of larger blocks, and performing the padding in favor of the smaller blocks. The segmenting is preferably performed such that any subsequent block has the same or a higher number of bit positions, or in other words, such that smaller blocks are located at the beginning while larger blocks are located at the end. Having the smaller blocks first and padding preferably the first blocks provides improved error rate performance.

In order to minimize the amount of padding bits, if suitable, two adjacent block sizes are selected for segmenting. In this way the maximum amount of padding bits to be used is at most 63. If a large number or even all blocks would have been selected of the same size, and a bit sequence was sliced into n turbo blocks, then up to n×64-I padding bits would be needed (assuming block sizes are a multiple of 64).

For example a bit sequence of 26 bits could be segmented into seven 4 bit blocks using two padding bits. However, as larger blocks are better in respect of error rate performance, this embodiment enables to use two 8 bit blocks and one 12 bit block, again using two padding bits. Furthermore it is preferred that smaller blocks comprise more padding bits than larger blocks, in order to increase the error rate performance of the smaller blocks by adding redundancy, which will bring the average error rate performance of all the transmitted and received blocks closer together.

According to an exemplary embodiment the extending and/or the segmenting and/or the re-ordering is/are performed such that any block comprises a plurality of empty bit positions that is equal to or higher than the number of empty bit positions in any block having more bit positions. It should be noted that this principle can be applied to any ordering of the blocks, i.e. no matter if small blocks are located in front of large blocks.

According to an exemplary embodiment the re-ordering comprises
    relocating the bits on the last P positions in the first block to another block, wherein P is smaller than half the number of bits in the first block; and
    relocating the bits on the first P positions in the first block to the last position in the first block. This embodiment includes to free space in the front part of blocks for the padding bits by relocating the corresponding bits to other blocks, for example to the end of the last block. This also achieves the advantage that the bits relocated in the beginning of the first block are confined to the first block, which improves the decoding performance of the sequence.

According to an exemplary embodiment the bit sequence is segmented into at least three blocks, and the re-ordering is performed such that empty bit positions are located at least at the beginning of the first two blocks, and such that bits are only relocated within the same block or from one block to the next block. This embodiment provides improved conditions for the decoding of the (channel coded) bit sequence later on. As bits are only relocated within the same block or are relocated to the next block, it is ensured that these bits will be available for the data processing as early as possible.

This is particularly beneficial if the bits need to be further processed after channel decoding in the receiver, because subsequent processing stages can start to process the first block of bits immediately once it is made available from the decoder without having to wait for bits from subsequent code blocks, which may only be processed after the first block. In this way so called pipelined processing is facilitated, bringing not only down latency but also reducing the amount of intermediate storage.

According to an exemplary embodiment the re-ordering is performed such that blocks located closer to the beginning of the bit sequence comprise at least the same number of empty positions as blocks located closer to the end of the bit sequence. In certain embodiments it is preferred that the padding bits (as well as the smaller blocks) are located rather in front of the bit sequence than in the last part thereof.

According to a further aspect a computer program product is provided, comprising program code stored on a computer readable medium for carrying out the above described method when the program product is run on a computer or network device.

According to another aspect of the inventors' proposal a device is provided for forming a bit sequence having a number of M bits from a bit sequence having a number of N bits, wherein $$\frac{M}{2} < N < M,$$

comprising:
    a unit for extending the bit sequence by M-N bit positions;
    a unit for selecting M-N bit positions within the bit sequence including the first bit position;
    a unit for re-ordering the bit sequence by relocating at least the bits on the selected positions such that the first bit position is empty and such that at least one bit remains at its original position; and a unit for filling empty bit positions with bits having a pre-determined value.

According to an exemplary embodiment the device comprises:

a unit for re-ordering the bit sequence such that the first M-N bit positions of the bit sequence are empty.

According to an exemplary embodiment the device further comprises:

a unit for segmenting the extended bit sequence into at least two blocks such that the number of bit positions in the first block is less than the number of bit positions in any subsequent block.

According to an exemplary embodiment the device comprises:

a unit for extending and/or segmenting and/or re-ordering the bit sequence such that any block comprises a plurality of empty bit positions that is equal to or higher than the number of empty bit positions in any block having more bit positions.

It should be noted that this principle can be applied to any ordering of the blocks, i.e. no matter if small blocks are located in front of large blocks.

According to an exemplary embodiment the device comprises:

a unit for relocating the bits on the last P positions in the first block to another block, wherein P is smaller than half the number of bits in the first block; and a unit for relocating the bits on the first P positions in the first block to the last position in the first block; such that P empty bit positions are located on the first P positions of the first block.

According to an exemplary embodiment the device comprises:

a unit for segmenting the bit sequence into at least three blocks; and a unit for performing the re-ordering such that empty bit positions are located at least at the beginning of the first two blocks, and such that bits are only relocated within the same block or from one block to the subsequent block.

According to another aspect of the proposal a communications apparatus is provided, comprising:

a channel coder requiring input bit sequences comprising data blocks having numbers of bits that are an integer multiple of a minimal block size; and a bit sequence forming device according to the previously described method for providing the input bit sequences.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
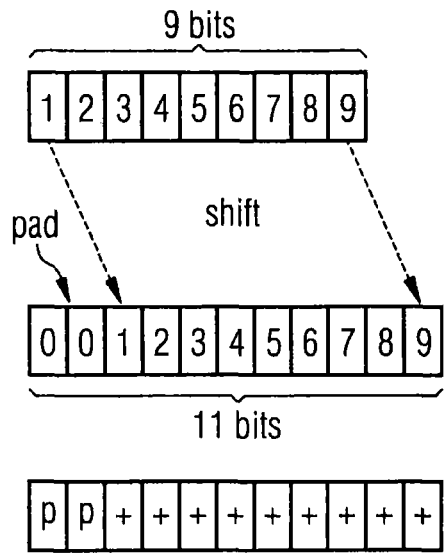
FIG. 1 shows a related art padding scheme.

Reference will now be made in detail to the preferred embodiments of the present invention, examples of which are illustrated in the accompanying drawings, wherein like reference numerals refer to like elements throughout.

It is to be noted that the sizes of (segmented) blocks can be selected from a set of pre-determined admissible block sizes, wherein the set of admissible block sizes not necessarily contains integer multiples of a minimum block size (or all integer multiples below the maximum block size). The following description will, for convenience of notation, be directed to cases where the block sizes are assumed to be integer multiples. However, it will be understood that the proposal can be applied to all block sizes and is not limited to block sizes of integer multiples.

The inventors propose an optimized interaction of padding and segmentation compared to the related art. This is done by optimizing the strategy to which turbo blocks to apply padding, i.e. preferring padding small blocks over padding large blocks. Additionally the padding can be done in a way that makes it easier to handle and more efficient with respect to power consumption/processing resources, as shifting of a majority of bits is avoided. The approach minimizes the amount of data to be shifted in memory. In advanced embodiments also the formed bit sequences can be decoded more efficiently in the decoding stage.

Padding bits will enhance the performance of the padded block, because the receiver does have pre-knowledge of the value of the padding bits (e.g. zero). This enhancement should be applied to the "weakest" blocks, as they are the ones that have the most severe impact on the overall performance, i.e. the blocks that have the highest required Eb/No to obtain a desired frame error probability. For turbo codes the performance gets better and better with increasing block size, therefore for turbo codes typically the smallest turbo block(s) will be the weakest ones and should preferably be padded.

The method proposes an optimized handling of padding. The turbo codes have been designed to be multiples of 8 (or even of 64 for larger blocks) to ease handling with typical processor architectures which work much better with bytes than bits. Padding in the front including shifting of the bits to free space for the padding bits potentially destroys this property, in particular if padding with a plurality of bits not divisible by 8 is done. It is proposed to ease this by moving an equivalent number of bits to the end of the turbo block and pad the space that was freed by them.

FIG. 1 shows an example of a related art scheme of padding turbo blocks in front. It is to be noted that this is a schematic view, showing for each bit a number (or character) related to its original position in a sequence. This is not to be confused with the actual value of that bit (which will usually be either 0 or 1 and is not shown here). It is assumed here that a block size of eleven bits shall be obtained. The related art scheme achieves this by shifting the nine bits to the end of a bit sequence that has been extended by two bits. The free two bit positions in front are then padded with filler bits, e.g. with the value "0". As can be seen from the bottom line in this figure, the whole nine bits have been shifted (indicated by "+"), while two bit positions in front have been padded (indicated by "p").

Figure 2:
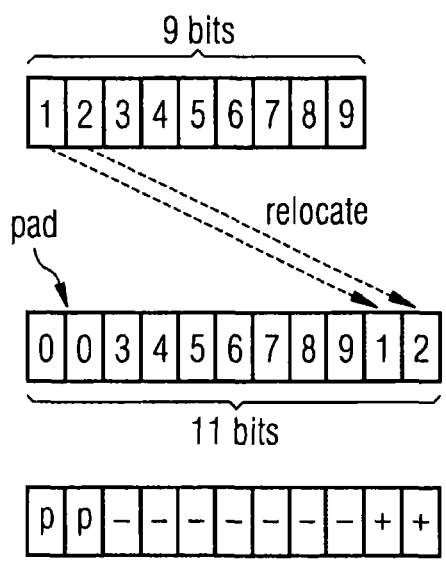
FIG. 2 shows an embodiment of a padding scheme according to the inventors' proposal.

FIG. 2 shows an exemplary embodiment of a scheme, applied to the same starting situation as depicted in FIG. 1. Again it is the object to obtain a bit sequence having eleven bits. Instead of simply shifting all bits to the end of a bit sequence extended by two bits, the method proposes to relocate only as many bits as necessary, in this case at least two. The first two bits are relocated to the end of the sequence, thus making room for the padding bits. The padding bits are filled in at the first two bit positions, similar to FIG. 1. As can be seen from the bottom line in FIG. 2, only two bits have been moved (indicated by "+"), while seven bits have remained on their original position (indicated by "−").

It should be apparent that the padding strategy reduces the number of bits to be shifted dramatically, especially for larger number of bits. Note that the number of bits will go into thousands or even tens of thousands for real applications.

Figure 3:
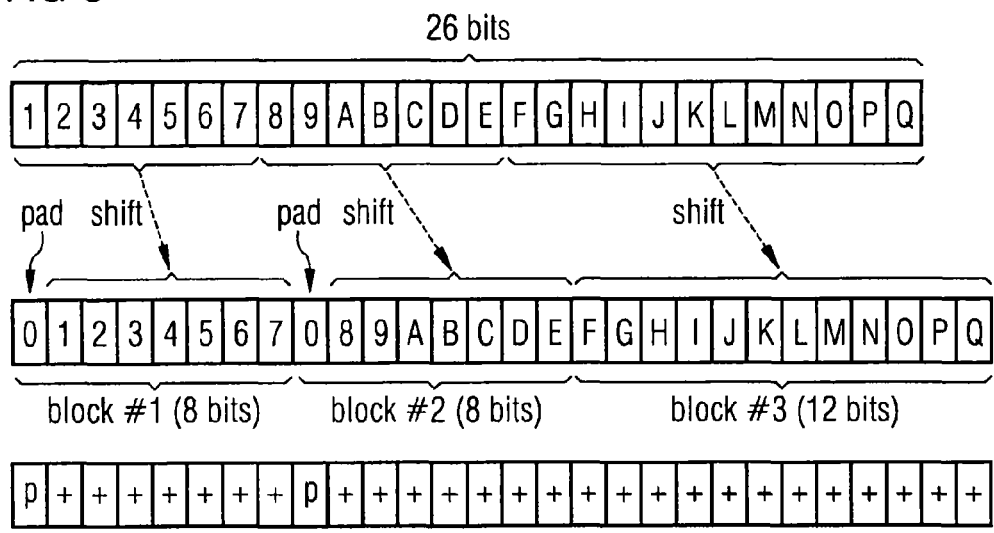
FIG. 3 shows an embodiment of a padding and segmenting scheme.

FIG. 3 shows another example of a padding scheme, in this case also including segmenting of a bit sequence. The starting bit sequence in this example has 26 bits. For turbo coders this sequence can therefore be divided in two 8-bit segments and one 12-bit segment, including two padding bits. Padding is done to the small blocks containing the 8-bit segments and for this purpose the bit sequence is segmented such that the small blocks are located at the beginning. This is achieved in the depicted manner, by shifting the first seven bits to the last positions of the first 8-bit block and padding the first bit position thereof. Similarly bits #8-#E are shifted to the last of the second 8-bit block, and the first bit position of the second block is padded. This finally entails that bits #F-#Q are shifted into the last 12-bit block.

As can easily be seen from the bottom line, this scheme results in all 26 bits of the original sequence being shifted (indicated by "+"). It should be noted that this example already achieves one aspect, i.e. padding the small segments instead of the larger ones to achieve better overall coding performance. However, this is done at the expense of shifting more bits from block to block.

Note that according to an embodiment only one of the smaller blocks is padded with two padding bits (in the example as in this figure). In other words, in a general case, padding is performed only on small blocks, which—depending on the actual number of padding bits to be distributed—may include that all or only a subset of small blocks is padded, e.g. with two bits (or other numbers of padding bits). If the aspect of reducing relocations is neglected it does not matter which one (or which ones, in case there is more than one small block to be padded). Also padding bits can be distributed evenly between the smaller blocks, smaller blocks in front can be favored with respect to subsequent blocks, or any other pattern of distribution of the padding bits can be used.

Figure 4:
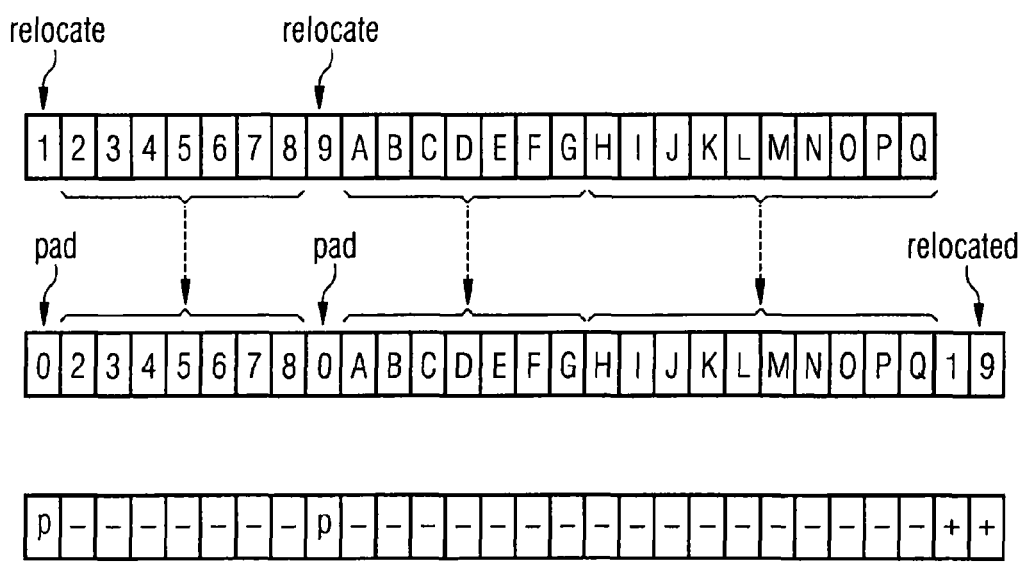
FIG. 4 shows another embodiment of a padding and segmenting scheme.

FIG. 4 shows an exemplary embodiment of a refined scheme, applied to the same starting situation as depicted in FIG. 3. The padding scheme is particularly advantageous if padding bits are to be inserted into multiple blocks. E.g. consider that 26 bits are to be segmented into three blocks of size 8, 8 and 12 (we assume for simplicity here the turbo block sizes are multiples of 4): bits are labeled 1-9 and A-Q. We further assume that the two smaller blocks in the beginning are padded with one padding bit each.

Bits #1 and #9 are relocated to the end of the bit sequence that has been extended by two bits. At the original bit positions of bit #1 and #9 padding bits (here having the value "0") are filled in. That is, the padding bits are inserted at the front of the first two blocks, as can be seen from the bottom line of FIG. 4 (indicated by "p"). Only two bits have been moved (indicated by "+"), while 24 bits remain at their original positions (indicated by "−"). This embodiment achieves padding of both the two smaller blocks and only requires two bits to be displaced, compared to all 26 bits for the related art approach. Note that this is achieved by moving some bits from one block to another block, in this case bits number #1 and #9 are moved from the first and second 8-bit block, respectively, to the last 12-bit block.

This embodiment therefore achieves already a big advantage compared to the related art methods. However, it would be preferable to be able to start utilizing the bits in subsequent processing stages as soon as possible in order to have the maximum utilization of the processing resources. If there is more than one turbo-block, it would be desirable to be able to start processing of data of the first block directly after this block has been decoded, in order to reduce power consumption and processing delay. This might not be possible with the implementation of the embodiment illustrated in FIG. 4, because before the data can be forwarded to the next step, one has to wait until a bit at the very end has been decoded (bit #1 in the example of FIG. 4).

Figure 5:
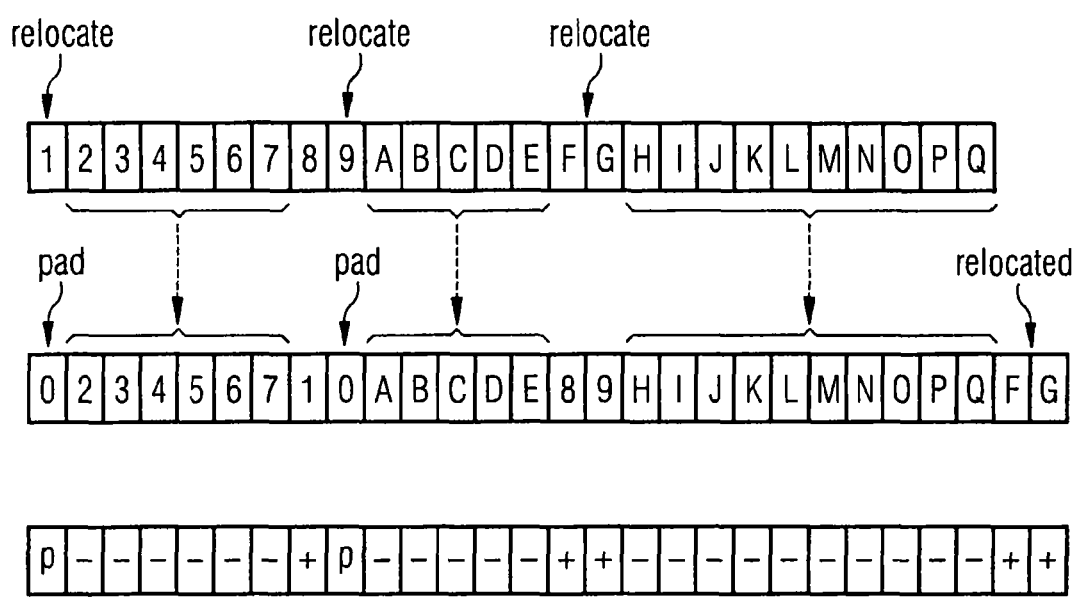
FIG. 5 shows yet another embodiment of a padding and segmenting scheme.

FIG. 5 illustrates a further advanced embodiment taking care of this problem. In this embodiment it is taken care that the bits from the beginning are not shifted all the way to the last code block, but are confined to the first block. In this way the first block of bits is encoded in the first turbo block. After decoding of the first block it is now possible to start immediately with subsequent processing stages (e.g. processing by higher layers like MAC or start to compute a CRC). This allows an efficient implementation of the decoding chain in a pipelined fashion. The expense is that now bits are moved in a daisy chain fashion from one block to the next, causing some movements in intermediate blocks as well (bits #8, #F, #G in the example shown here).

That is, the number of bits to be moved or relocated (here 5 bits, indicated by "+") increases with respect to the previous embodiments, where only a number of bits is moved that is equal to the number of padding bits to be inserted. This embodiment enables a trade-off between bit movement and improved decoding performance of the formed bit sequence to be made.

The principle of increasing the number of bits that remain on their original positions can not only be applied for the case of padding and in particular for padding of turbo codes, but also in other areas. For example, let us assume that bits are to be mapped to positions for transmission. These bits to be mapped are called data-bits in the following. Note that it is irrelevant for this aspect, how these bits are obtained and how they are coded. The most straight forward and thus simplest mapping is to map the bits in their original order to the positions for transmission. However, there may be cases where some of the positions are not available to transmissions of the bits to be mapped, i.e. the data-bits. Some of these positions may be reserved for other purposes like channel estimation, lower layer signaling or other purposes. Then these bits need to be exempted from the mapping process. As a special case, it may be possible that some of the positions are only reserved in some cases or for some transmission frames, whereas the same positions are available for other cases. It is an objective to describe a scheme that is simple and flexible to handle both cases efficiently and with maximum commonality. In particular it is desirable to allow a significant number of bits to be mapped to the same position irrespectively whether some of these positions are temporarily reserved.

The method and device will be described now by examples, which should not be understood to limit the scope. Let us assume that 9 bits are to be mapped to transmission positions. If all positions are available, it is apparent to map them in natural order:

1 2 3 4 5 6 7 8 9; option 0

This mapping is called option 0 to ease reference to this mapping; the following mappings will also be identified as different options. However, let us assume now that the position 3 is not available for transmission, e.g. because a lower layer information is transmitted on that bit, e.g. an acknowledgement signal. Clearly then only 8 bits can be transmitted.

The simplest approach is simply not to transmit the bit number 3 that would otherwise end up at that position:

1 2 A 4 5 6 7 8 9; option a

Here the A denotes the reserved position. This approach, which basically punctures the bits that would end up at unavailable positions, is inefficient, if the data have first been encoded and rate matched. The additional puncturing will cause a poor overall puncturing pattern. In LTE a specific puncturing algorithm, so called Circular Buffer (CB) is used. Basically the encoded bits are interleaved with a specific interweaver, and then a block of bits is selected for transmission. The more bits can be transmitted the larger is the selected block. If some bits less are to be transmitted, the block is shortened by some bits. In the above example, this corresponds not to transmit bit number 9 instead of not transmitting bit number 3:

1 2 A 3 4 5 6 7 8, option b

This approach will outperform option a above due to a better puncturing approach. However, comparing option a and b with the case where position 3 is available, reveals that in this case all the bits 3 to 8 have to be shifted. This is similar to the case where bits have to be shifted because padding is applied. It is an objective of this aspect to achieve similar advantages as obtained for padding, by applying similar schemes, however adapted to this case. Some of the schemes described above will now be explained for the concept of mapping, it should be noted however, that all the other schemes can be applied as well. The mapping is then:

1 2 A 4 5 6 7 8 3; option c

Almost all the bits remain on their positions as if position 3 was not reserved (A), bit 3 is relocated to the end, bit 9 is not transmitted. Option c achieves advantages of both options a and b: Like in option b bit 3 is transmitted and bit 9 is punctured, giving a superior puncturing pattern. Like in option a most of the bits are transmitted at the same positions as in option 0, only bit number 3 is relocated.

The principle can also be extended for the case that more than one position is unavailable, in this example 2 positions. The unavailable positions do not necessarily have to be adjacent.

1 2 A 4 A 6 7 3 5; option d

Bits 3 and 5 which would correspond to the not available positions are relocated to the end, replacing bits 8 and 9. Option d can be slightly optimized, by mapping the displaced bits in reverse order:

1 2 A 4 A 6 7 5 3; option e

This allocation is beneficial, because it allows a particularly easy implementation of the mapping procedure: Bits are mapped in ascending order to transmission positions. If a bit cannot be mapped because a positions is unavailable, then it is mapped from the end. In the example, bit 3 is the first such bit and is mapped to the last position. The next bit to be remapped is bit 5 which is consequently mapped to the second last position. There may be cases, where also positions at the end are unavailable, e.g. position 9. In this case bit 3 would be remapped to the next available position i.e. position 8.

The advantage of option e over option d is that when bit 3 is remapped it is not necessary to determine the total number of remapped bits as would be necessary for option d. An alternative implementation would be to store the remapped bits separately and map them only later when this number is available.

As will become apparent from the description and the drawings for those versed in the art, it is possible to combine the principle of relocation for mapping to transmission positions with the embodiments described for padding e.g. confining relocations preferably to the same block.

To summarize, the inventors propose to employ one or more of the following:

perform padding (if necessary) preferably on the smaller blocks, when segmenting the bits to be turbo-encoded into several turbo blocks (of different size);

evenly distribute padding bits (or as evenly as possible) to the smaller blocks, or only perform padding on the first block (s); preferably perform segmenting such that smaller blocks are located in the beginning of a bit sequence; preferably confine bits that are relocated from the beginning of a block to the same or the subsequent block.

preferably perform bit mapping in a way that the number of bits that have to be relocated in case some positions are unavailable is reduced;

The method and device provide an improved padding and segmenting or mapping scheme, resulting in less processing resources and less processing time being used, or resulting as improved error rate performance or a reduced processing delay of the formed bit sequences at the decoding stage or a combination thereof.

It is to be noted that the principles of the proposed padding and segmenting or mapping scheme have been described, as is commonly done for communication systems, from the point of view of the transmitter of the bits. The receiver will have to perform suitably processing steps that basically mirror or reverse, respectively, the operations in the transmitter, as will be apparent to those skilled in the art. Such mirror operations include but are not limited to:

Relocating bits inversely compared to the relocation done in the transmitter;

Making use of pre-knowledge of bits that have been padded with pre-known data (e.g. 0). One way to do so is to assume perfect soft values for these bits (so called soft values typically indicate the certainty with witch a given bit is having a value of 1 or 0, respectively). Then this a priori information can be used for the decoding operation.

Removing padded bits having fixed values after decoding.

As such, the proposal does not only relate to a transmitting method, device and apparatus, but also to a corresponding receiving method, device and apparatus. Both receiving and transmitting devices may be terminals, end user devices or base stations in a communication system, but may even comprise intermediate stations that may be used e.g. for relaying.

If the processing is always performed in the same way, i.e. according to any embodiment (or any combination thereof), then the receiver does not have to be provided with any additional explicit information to be able to receive, process and in particular decode the transmission. All of the specific segmentation, specific padding, specific mapping and specific relocation of bits are then pre-known or pre-set both at the transmitter and receiver and will allow the latter to operate.

Furthermore it is to be noted that not necessarily all aspects have to be applied in any method, apparatus or device in combination, but only a subset may be selected. For example only preferring small block(s) for padding or only increasing the number of bits that remain at their original position or only increasing number of bits that remain together in the same sub-block is possible.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in Superguide v. DIRECTV, 69 USPQ2d 1865 (Fed. Cir. 2004).

The invention claimed is:

1. A method for forming a bit sequence having a number of M bits from a bit sequence having a number of N bits for turbo coding, wherein $$\frac{M}{2} < N < M,$$

the method comprising:
extending said bit sequence by M-N bit positions to produce an extended bit sequence;
segmenting said extended bit sequence into at least two blocks with different numbers of bit positions such that the number of bit positions in a first block is less than the number of bit positions in a last block; and
filling empty bit positions with bits having a pre-determined value.

2. The method according to claim 1, wherein said extending and/or said segmenting is performed such that at least one empty bit position is created in said first block.

3. The method according to claim 1, further comprising:
re-ordering said extended bit sequence such that at least one empty bit position is created in said first block.

4. A non-transitory computer-readable medium causing a computer or network device to execute operations to carry out a method of forming a bit sequence having a number of M bits from a bit sequence having a number of N bits for turbo coding, in which $$\frac{M}{2} < N < M,$$

the method comprising:
extending said bit sequence by M-N bit positions to produce an extended bit sequence;
segmenting said extended bit sequence into at least two blocks with different numbers of bit positions such that the number of bit positions in a first block is less than the number of bit positions in a last block; and
filling empty bit positions with bits having a pre-determined value.

5. A device for forming a bit sequence having a number of M bits from a bit sequence having a number of N bits for turbo coding, in which $$\frac{M}{2} < N < M,$$

the device comprising:
means for extending said bit sequence by M-N bit positions to produce an extended bit sequence;
means for segmenting said extended bit sequence into at least two blocks with different numbers of bit positions such that the number of bit positions in a first block is less than the number of bit positions in a last block; and
means for filling empty bit positions with bits having a pre-determined value.

6. The device according to claim 5, wherein
the means for extending and/or the means for segmenting create at least one empty bit position in said first block.

7. The device according to claim 5, further comprising:
means for re-ordering said extended bit sequence such that at least one empty bit position is created in said first block.

8. A communications apparatus, comprising:
a channel coder requiring input bit sequences comprising data blocks having numbers of bits that are an integer multiple of a minimal block size; and
a bit sequence forming device for forming said input bit sequences, each bit sequence being formed to have a number of M bits, each bit sequence being formed from a bit sequence having a number of N bits for turbo coding, in which $$\frac{M}{2} < N < M,,$$

the device comprising:
means for extending said bit sequence by M-N bit positions to produce an extended bit sequence;
means for segmenting said extended bit sequence into at least two blocks with different numbers of bit positions such that the number of bit positions in a first block is less than the number of bit positions in a last block; and
means for filling empty bit positions with bits having a pre-determined value.

\* \* \* \* \*